(12) United States Patent
Lee et al.

(10) Patent No.: US 6,515,329 B2
(45) Date of Patent: Feb. 4, 2003

(54) FLASH MEMORY DEVICE AND METHOD OF MAKING SAME

(75) Inventors: Won-Hong Lee, Suwon (KR);
Sung-Nam Chang, Suwon (KR);
Kyu-Charn Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/068,483

(22) Filed: Feb. 5, 2002

(65) Prior Publication Data
US 2002/0072167 A1 Jun. 13, 2002

Related U.S. Application Data

(62) Division of application No. 09/724,152, filed on Nov. 28, 2000, now Pat. No. 6,380,032.

(30) Foreign Application Priority Data

Feb. 11, 2000 (KR) .............................................. 00-06446

(51) Int. Cl.$^7$ ...................... H01L 29/788; H01L 29/108
(52) U.S. Cl. ........................ 257/315; 257/296; 257/321; 257/316

(58) Field of Search ................................. 257/315, 314, 257/316, 549–550, 905, 306, 296, 288, 300, 301, 321, 330, 317–318, 752; 438/257–267, 386, 387

(56) References Cited

U.S. PATENT DOCUMENTS 5,282,160 A * 1/1994 Yamagata .................... 365/185
5,814,862 A * 9/1998 Sung et al. .................. 257/344

* cited by examiner

Primary Examiner—Olik Chaudhuri
Assistant Examiner—(Vikki) Hoa B. Trinh
(74) Attorney, Agent, or Firm—Mills & Onello LLP

(57) ABSTRACT

Provided are a non-volatile flash memory device and a method of making the non-volatile flash memory device. A common source line is formed simultaneously with the formation of stacked transistors. The common source line is formed of the same material layer as floating gate pattern. The common source region and a scribe line region are simultaneously formed thorough the same photolithography process in a semiconductor substrate. Additionally, the common source line and butted contact are patterned simultaneously through the same photolithography process. Accordingly, the common source line process can be advantageously completed with very low cost and simplicity.

5 Claims, 15 Drawing Sheets

FLASH MEMORY DEVICE AND METHOD OF MAKING SAME

RELATED APPLICATIONS

This application is a divisional of copending U.S. application Ser. No. 09/724,152, filed on Nov. 28, 2000, now U.S. Pat. No. 6,380,032, the contents of which are incorporated herein in their entirety by reference.

Field of the Invention

The present invention relates to semiconductor device manufacturing, and more particularly to a flash memory device and method of making a semiconductor device.

BACKGROUND OF THE INVENTION

Information storage devices, i.e., memories, are widely used in data processing systems. Semiconductor memory devices can be largely divided into two groups: volatile memory devices and non-volatile memory devices. The volatile memory device loses data stored in memory cells when power is removed. The non-volatile memory device, however, preserves data stored in memory cells when power is removed from the memory. Among non-volatile memory devices, NAND type flash memory with a serial memory cell structure is becoming important in the art due to its high degree of integration density.

The flash memory device has a programming mode, an erasing mode and a reading mode. The device requires a common source line to provide a ground voltage during the reading mode. In a conventional method of forming a common source line in a flash memory device, a gate oxide layer, a floating gate polysilicon layer, an inter-gate insulating layer and a control gate polysilicon layer are sequentially formed on a semiconductor substrate. Through photolithographic processes, the stacked layers are patterned to form a stacked gate pattern. Impurities are implanted into the substrate using the stacked gate pattern as an implanting mask to form source/drain regions outside of the stacked gate pattern. An interlayer insulating layer is deposited on the resulting structure. Using a photoetching process, the interlayer insulating layer is patterned to form a contact hole, exposing a predetermined source/drain region of the semiconductor substrate. A conductive layer is then deposited in the contact hole and on the interlayer insulating layer. A planarization process such as an etch-back or a chemical mechanical polishing (CMP) is carried out to leave the conductive layer in the contact hole and remove the portion of the conductive layer that is outside of the contact hole, thereby forming a common source line. An insulator is deposited on the resulting structure having the common source line. Using photolithographic processes, the insulator and the interlayer insulating layer are sequentially patterned to form a bit line contact hole. A conductive material is formed in the bit line contact hole and on the insulator and is patterned to form a bit line.

This conventional method has certain drawbacks. Since the conventional method requires photolithographic processes to form a contact hole for a common source line, misalignment can occur. This can cause undesirable etching of the stacked gate pattern and a resulting electrical bridge between the stacked gate pattern and the common source line. Also, since the common source line is formed after the formation of the stacked gate pattern, problems with the bit line process can arise. During the formation of the bit line contact hole, both the interlayer insulating layer that insulates the stacked gate pattern and the common source line and the insulator that insulates the common source line the bit line are etched. These layers to be etched are so thick that the bit line contact hole can be opened imperfectly. If the thicknesses of the insulators are reduced in order to avoid this imperfect opening of the bit line contact hole, the common source line can be exposed during patterning of the bit line, thereby causing a short between the bit line and the common source line.

SUMMARY OF THE INVENTION

The present invention is directed to an approach to forming a flash memory device which solves these drawbacks found in the prior art. In particular, the invention is directed to formation of a flash memory device in which short circuits between a bit line and a common source line are avoided.

A feature of the present invention is that the common source line is made of the same layer as a floating gate of a stacked gate pattern. The common source line is patterned together with the stacked gate pattern in the same photolithographic process. Also, during this photolithographic process, a butted contact can be defined. The resulting common source line is lower in level than the stacked gate pattern. As a result, processes for forming the common source line can be simplified. Also, the thickness of the layers to be etched during bit line contact process can be reduced without reducing the distance between the bit line and the common source line, thereby providing a reliable bit line contact process.

In accordance with the present invention, there is provided a method of forming a flash memory device. In accordance with the method, a material layer is formed on a semiconductor substrate where a stacked gate pattern forming region and a common source line forming region are defined. The material layer is patterned to form an opening exposing the common source line forming region. A floating gate conductive layer, an inter-gate insulating layer and a control gate conductive layer are formed on the material layer and in the opening. The control gate conductive layer, the inter-gate insulating layer, the floating gate conductive layer and the material layer are patterned to form a stacked gate pattern on the stacked gate pattern forming region and to form a common source line in contact with the common source line forming region through the opening.

In one embodiment, a mask insulating layer, having an etching selectivity with respect to the inter-gate insulating layer, is formed on the control gate conductive layer. Patterning the control gate conductive layer, the inter-gate insulating layer, the floating gate conductive layer and the material layer includes patterning the mask insulating layer and the control gate conductive layer until the inter-gate insulating layer is exposed to form a control gate pattern aligned over the stacked gate pattern forming region. A photoresist layer pattern is formed on the inter-gate insulating layer, the photoresist layer pattern being in parallel with the control gate pattern and running over the common source line forming region. Using the photoresist layer pattern and the mask insulating layer of the control gate pattern, the inter-gate insulating layer, the floating gate conductive layer and the material layer are sequentially patterned.

In one embodiment, the floating gate conductive layer is formed of a polysilicon layer. The control gate conductive layer can be made of a stacked layer of polysilicon and tungsten silicide. The inter-gate insulating layer can be formed of an ONO (oxide-nitride-oxide) layer. The mask oxide layer can be formed of an oxide layer by a plasma enhance chemical vapor deposition technique. The material layer can be made of a gate oxide layer or a combination gate oxide/polysilicon layer.

After the opening is formed, impurities of the conductivity type opposite to the conductivity type of the semiconductor substrate are implanted to the semiconductor substrate. This provides a conductive path to the common source line forming region.

In one embodiment, after the stacked gate pattern and the common source line are formed, an insulator is formed. A bit line can be formed on the insulator to intersect the common source line.

In accordance with the present invention, there is provided a flash memory device cell. The flash memory device cell includes a plurality of stacked gate patterns formed on a semiconductor substrate. Each stacked gate pattern is made of a gate insulator pattern, a floating gate pattern over the gate insulator pattern, an inter-gate insulator pattern over the floating gate pattern and a control gate pattern over the inter-gate insulator pattern. The stacked gate pattern also includes a common source line made of the same layer as the floating gate pattern.

In one embodiment, the floating gate pattern is made of a first floating gate and a second floating gate, and the common source line is made of the second floating gate. The floating gate pattern can be made of polysilicon, the control gate pattern can be made of a stacked layer of polysilicon and tungsten silicide, and the inter-gate insulator pattern can be made of an ONO (oxide-nitride-oxide) layer.

In one embodiment, the flash memory device cell further includes a plurality of trench isolation regions formed at predetermined portions of the semiconductor substrate and defining a plurality of active regions therebetween. A plurality of common source line regions can be formed between predetermined stacked gate patterns. In this configuration, the plurality of stacked gate patterns intersect the plurality of trench isolation regions and the active regions. The common source line can be in parallel with the stacked gate patterns and can be in contact with the common source line regions and the plurality of trench isolation regions.

In one embodiment, the memory device cell also includes an insulation layer covering the plurality of stacked gate patterns and the common source line. A bit line is formed on the insulating layer, the bit line intersecting the common source line. In accordance with the present invention, there is provided a method of forming a flash memory device. The method includes forming a plurality of trench isolation regions defining active regions on predetermined portions of a semiconductor substrate of a first conductivity type, and forming a gate oxide pattern and a first floating gate pattern on the active regions. The first floating gate pattern and the gate oxide pattern are sequentially patterned to form openings exposing predetermined portions of the active regions. Impurities of a second conductivity type are implanted into the exposed active regions by the openings to form common source line regions. A second floating gate pattern is formed to cover the first floating gate pattern and the common source line regions and expose the trench isolation regions. An inter-gate insulating layer is formed on the resulting structure. A plurality of control gate patterns are formed on the inter-gate insulating layer to intersect the active regions and the trench isolation regions. A photoresist layer pattern is formed on the inter-gate insulating layer between the control gate patterns, the photoresist layer pattern being in parallel with the control gate patterns and running over the common source line regions. Using the photoresist layer pattern and the control gate patterns, the inter-gate insulating layer, the second floating gate pattern and the first floating gate pattern are sequentially patterned to form a plurality of stacked gate patterns and a common source line, the stacked gate patterns intersecting the active regions and the trench isolation regions, and the common source line being in contact with the common source line regions and in contact with portions of the trench isolation regions and in parallel with the stacked gate patterns.

In one embodiment, the control gate pattern is made of a control gate conductive layer pattern and a mask insulator pattern. The mask insulator pattern has an etching selectivity with respect to the inter-gate insulating layer. The first and second floating gate patterns can be made of polysilicon. The control gate conductive layer pattern can be made of a combination polysilicon/tungsten silicide. The inter-gate insulating layer can be made of an ONO(oxide-nitride-oxide) layer. The mask insulator pattern can be made of an oxide by a plasma enhanced chemical vapor deposition technique.

Sequentially patterning the first floating gate pattern and the gate oxide layer to form openings exposing predetermined portions of the active regions can also expose a predetermined region of the trench isolation where a scribe line is to be made. Also, the photoresist layer pattern can be further formed on the inter-gate insulating layer to cover a butted contact forming region. Herein, a butted contact is formed while sequentially patterning the inter-gate insulating layer, the second floating gate pattern and the first floating gate pattern.

In one embodiment, forming a plurality of trench isolation regions, a gate oxide pattern and a first floating gate pattern on the semiconductor substrate includes sequentially forming a gate oxide layer, a first floating gate layer and a nitride layer on the semiconductor substrate. The nitride layer, the first floating gate layer and the gate oxide layer are sequentially patterned to form a trench etching mask. Using the trench etching mask, the semiconductor substrate is etched to form a plurality of trenches. The trenches are filled with an insulating material, and the nitride layer is removed.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A to 10A are schematic cross-sectional views of a semiconductor substrate taken along line I—I of FIG. 1A, at selected stages of a method of forming a flash memory device, in accordance with the present invention.

FIGS. 2B to 10B are schematic cross-sectional views of a semiconductor substrate taken along line II—II of FIG. 1A, at selected stages of a method of forming a flash memory device, in accordance with the present invention.

FIGS. 2C to 10C are schematic cross-sectional views of a semiconductor substrate taken along line III—III of FIG. 1A, at selected stages of a method of forming a flash memory device, in accordance with the present invention.

DETAILED DESCRIPTION OF PREFERRED EMBODIMENTS OF THE INVENTION

Figure 1A:
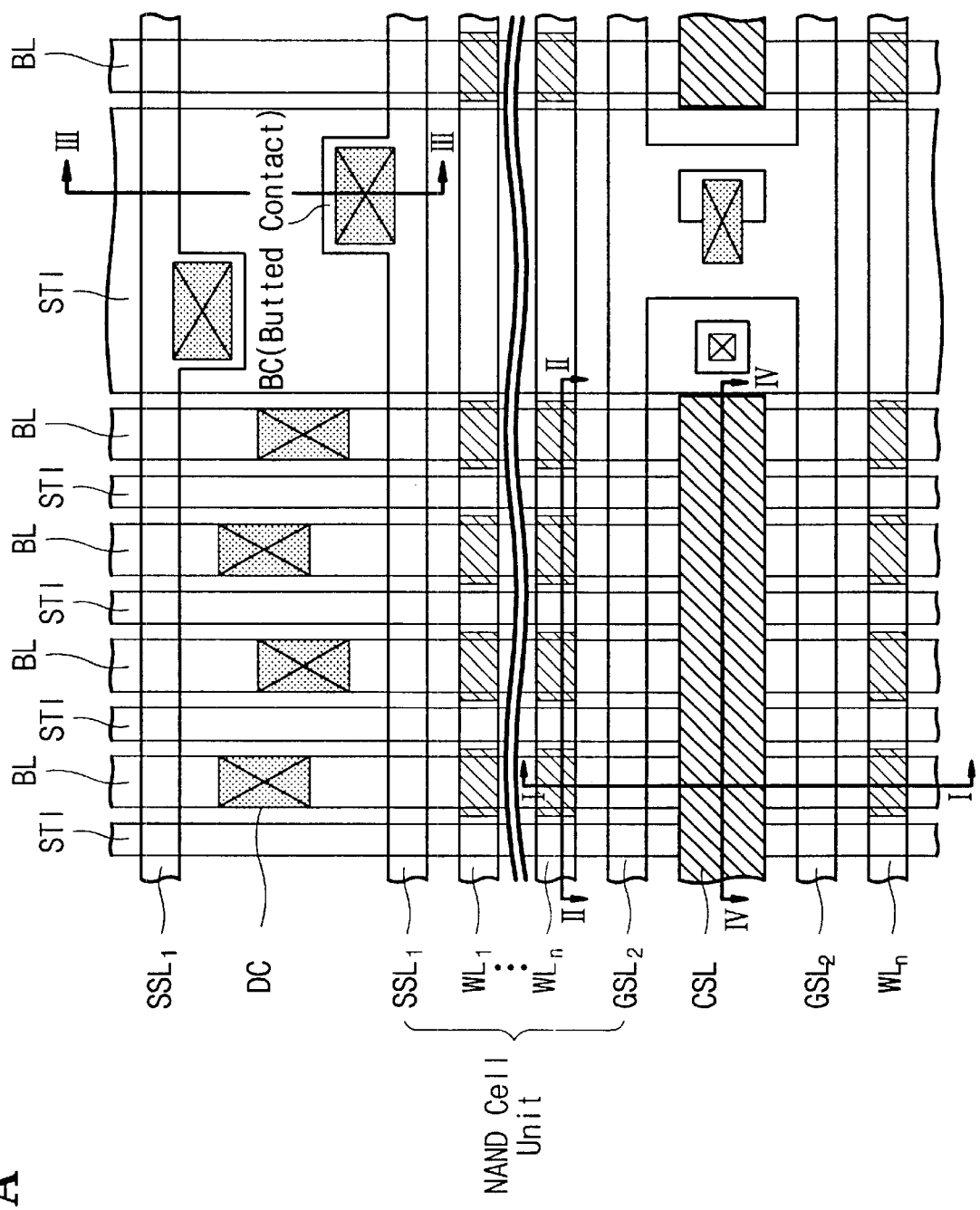
FIG. 1A schematically illustrates one embodiment of a NAND type flash memory device in accordance with the present invention.

The present invention will now be described more fully hereinafter with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

The present invention relates to a flash memory device and a method of forming a flash memory device, and more particularly to a common source line of the flash memory device. Hereinafter a NAND type flash memory device and a method of forming thereof in accordance with a preferred embodiment of the present invention will be described.

Referring now to FIG. 1A, a plurality of shallow trench isolation (STI) regions and a plurality of active regions are alternately disposed horizontally. A plurality of string selection lines (SSL), for example two SSL1, run across the STI regions and the active regions. Also, a plurality of ground select lines (GSL), for example two GSL2, run across the STI regions and the active regions. Between the ground select line (GSL2) and the string select line (SSL1), a plurality of serial word lines (WL1 . . . WLn), for example, n numbered word lines run in parallel therewith. Outside of the ground select line (GSL2) opposite to the word line n(WLn), i.e., between the string select lines (GSL2), runs a common source line (CSL) in parallel therewith. Also, the string select line (SSL1) is exposed by a butted contact (BC). A plurality of bit lines (BL) run over the active regions between the STI regions, intersecting the CSL, WL, GSL2 and SSL1. Each bit line is electrically connected to the active region between the string select lines (SSL1).

The string select line (SSL1), the ground select line (GSL2) and the n numbered serial word lines (WL1 . . . WLn) therebetween make up a NAND cell unit together with the bit line (BL) and the common source line (CSL). A plurality of NAND cell units are repeatedly arranged to constitute a NAND type flash memory device. Herein, if the n number word lines are arranged parallel to each other, then the cell becomes NOR type flash memory device.

Figure 1B:
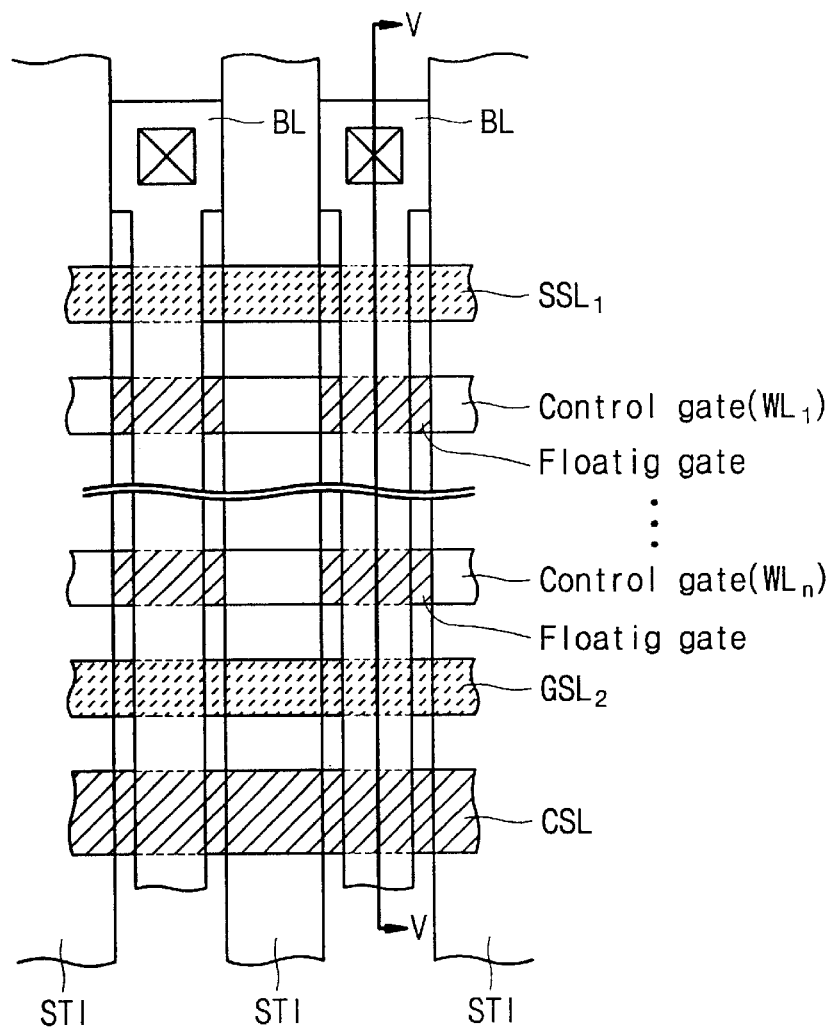
FIG. 1B schematically illustrates a NAND cell unit (string) of the flash memory device shown in FIG. 1A.
Figure 1C:
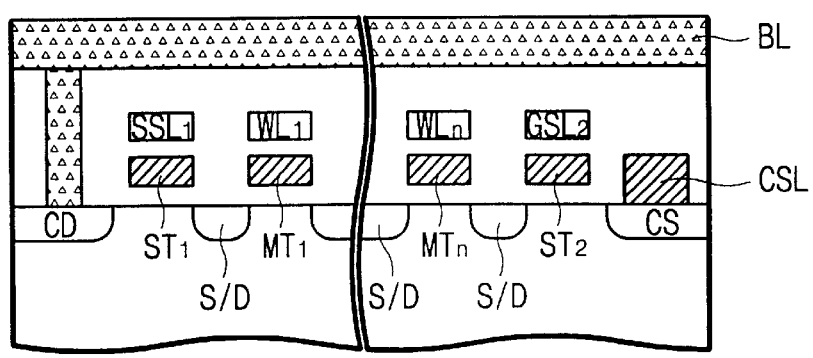
FIG. 1C is a schematic cross-sectional view taken along line V—V of FIG. 1B.

A NAND cell unit is illustrated in FIGS. 1B and 1C. Referring to FIGS. 1B and 1C, each word line (WL) intersects the STI regions and the active region therebetween and is made of a stacked gate pattern of two gate patterns, i.e., a floating gate pattern and a control gate pattern. The floating gate pattern of each word line is formed only on the active regions. The control gate pattern of each word line is formed over the floating gate and over the STI regions with an inter-gate insulating layer disposed therebetween, thereby intersecting the STI regions and the active regions. Herein, the floating gate pattern constitutes a memory transistor together with impurity diffusion region, i.e., source/drain regions(S/D), at the active region outside thereof. Also the string select line (SSL1) and the ground select line (GSL2) are made of two gate patterns of a floating gate pattern and a control gate pattern. Unlike the word line that has a separated floating gate pattern by the STI regions, the floating gate patterns of the string select line (SSL1) and ground select line (GSL2) are not separated but a continuous one, i.e., line type. Likewise, the floating gates of the ground select line (GSL2) and string select line (SSL1) constitute memory transistors (ST2 and ST1) together with impurity diffusion region, i.e., source/drain regions(S/D), at the active region outside thereof. The bit line (BL) is electrically connected to the impurity diffusion region, i.e., common drain region(CD), outside of the string select line (SSL1) opposite to the word line 1 (WL1). The common source line (CSL) is in direct contact with impurity diffusion region, i.e., common source region (CS), outside of the ground select line (GLS2). The common source line (CSL) is made of the same layer as the floating gate pattern of the WL, GSL2, and SSL1.

Hereinafter the method of forming the NAND type flash memory device described above will be described with reference to cross-sectional views of the semiconductor device. FIGS. 2A, 3A, 4A, 5A, 6A, 7A, 8A, 9A and 10A (referred to herein as FIGS. 2A to 10A) are cross-sectional views of the semiconductor device taken along line I—I (along the active regions) of FIG. 1A, at selected stages of formation of a flash memory device in accordance with the invention. FIGS. 2B, 3B, 4B, 5B, 6B, 7B, 8B, 9B and 10B (referred to herein as FIGS. 2B to 10B) are cross-sectional views of a semiconductor substrate taken along line II—II (across the STI regions and the active regions) of FIG. 1A, at selected stages of formation of a flash memory device. FIGS. 2C, 3C, 4C, 5C, 6C, 7C, 8C, 9C and 10C (referred to herein as FIGS. 2C to 10C) are cross-sectional views of a semiconductor substrate taken along line III—III (along the STI regions where the butted contact is to be made) of FIG. 1A, at selected stages of formation of a flash memory device.

Figure 2A:
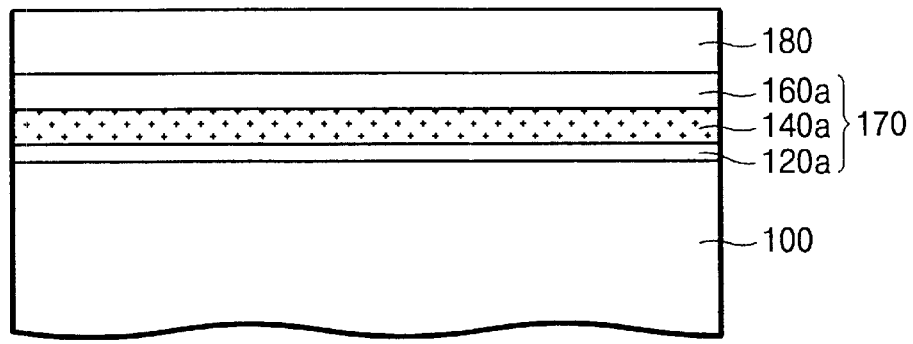
Figure 2B:
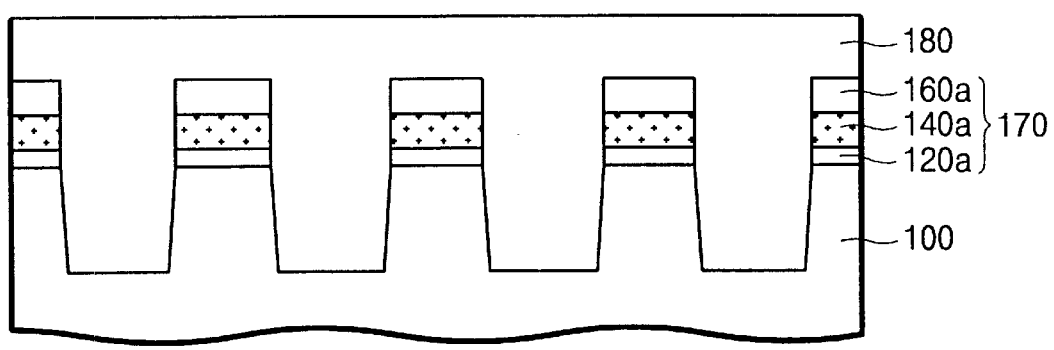
Figure 2C:
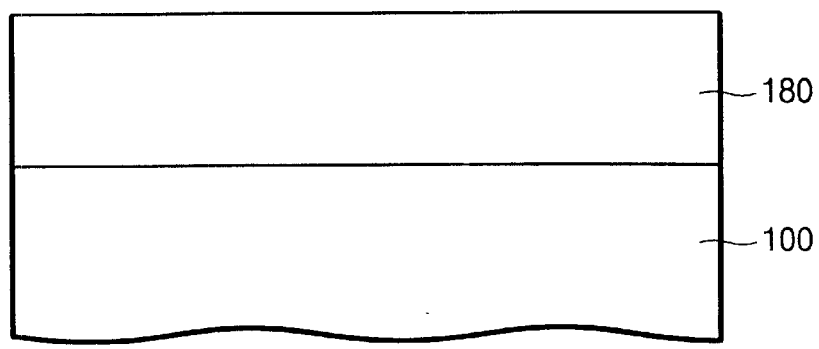

Referring now to FIGS. 2A to 2C, a gate oxide layer, a first floating gate conductive layer and a nitride layer are sequentially formed on the semiconductor substrate 100. Through a photo-etching process, the nitride layer, the first floating gate conductive layer and the gate oxide layer are patterned to form a trench etching mask pattern 170. The trench etching mask pattern 170 is made of a gate oxide pattern 120a, a first floating gate pattern 140a and a nitride pattern 160a formed from the gate oxide layer, the first floating gate conductive layer and the nitride layer, respectively. At this time, the semiconductor substrate covered by the trench etching mask pattern 170 has defined an active region. Using the trench etching mask pattern 170, the exposed semiconductor substrate is etched to a predetermined depth to form a trench. A trench filling insulator 180 is deposited in the trench and on the nitride pattern 160a.

Figure 3A:
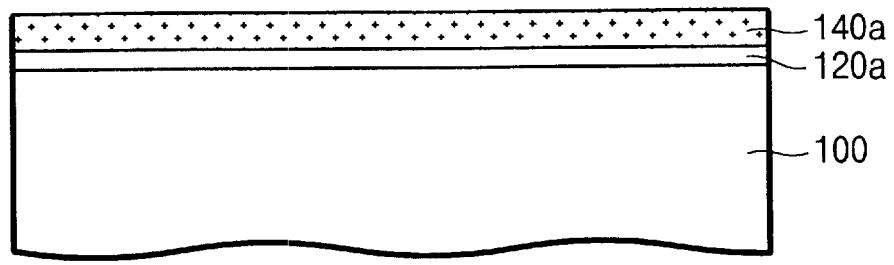
Figure 3B:
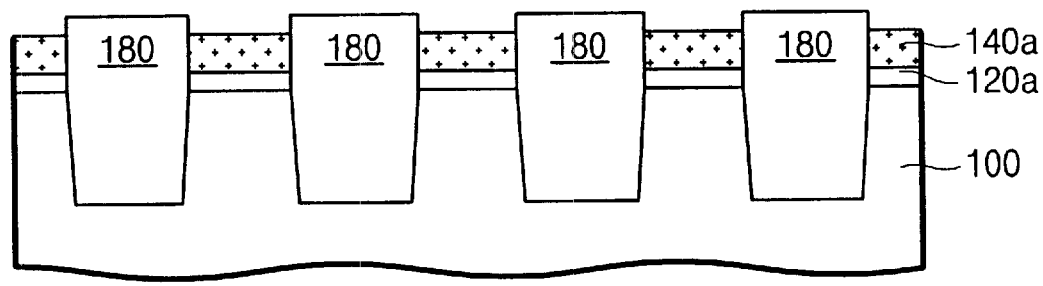
Figure 3C:
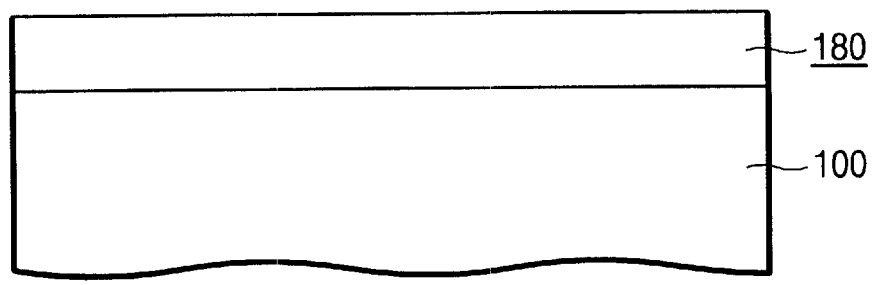

Referring to FIGS. 3A to 3C, the trench filling insulator 180 is planarized down to a top surface of the nitride pattern 160a by chemical mechanical polishing (CMP) or an etchback back technique. In turn, the exposed nitride pattern 160a is removed by a wet chemical such as phosphoric acid to form shallow trench isolation (STI) regions 180.

Figure 4A:
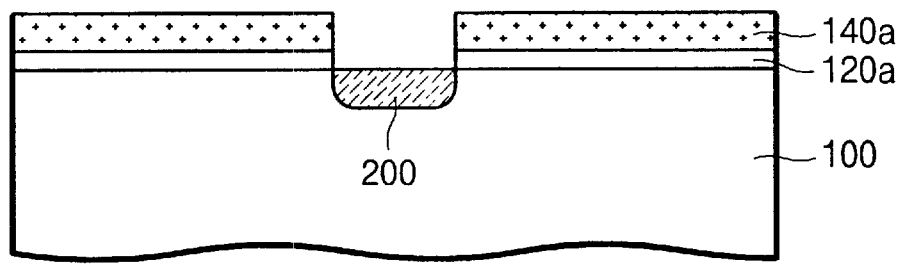
Figure 4B:
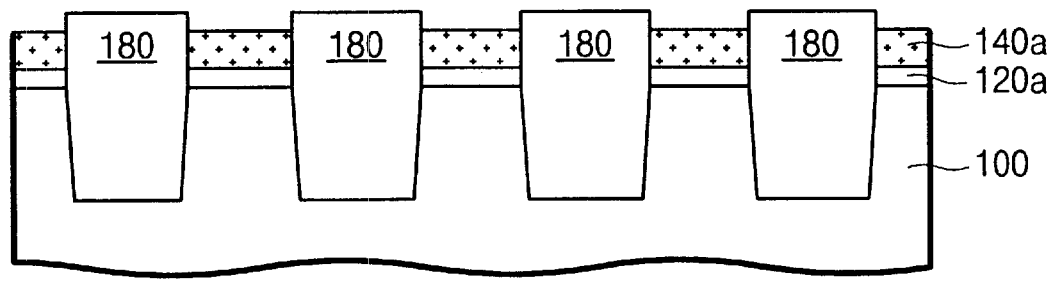
Figure 4C:
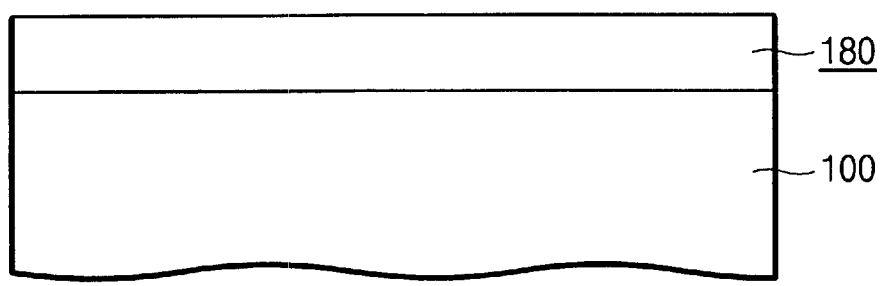

After forming STI regions 180 and defining active regions, a photo-etching process for opening a scribe line is carried out to avoid misalignment in subsequent photo-etching processes. At this time, the first floating gate pattern 140a and the gate oxide pattern 120a are patterned to form openings that expose predetermined portions of the active regions with which a common source line of FIG. 1A is to be in contact. Then, impurities of opposite conductivity type to the semiconductor substrate 100 are implanted into the exposed active regions through the openings to provide a conductive path and thereby forming common source line regions 200 as shown in FIGS. 4A to 4C. The common source line regions are concurrently formed by a conventional scribe line process.

Figure 5A:
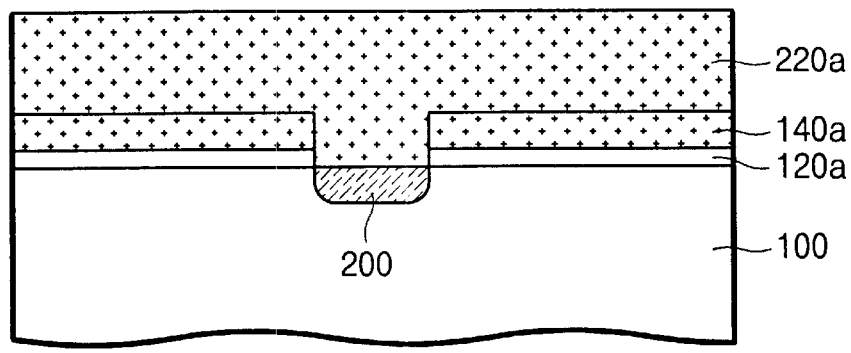
Figure 5B:
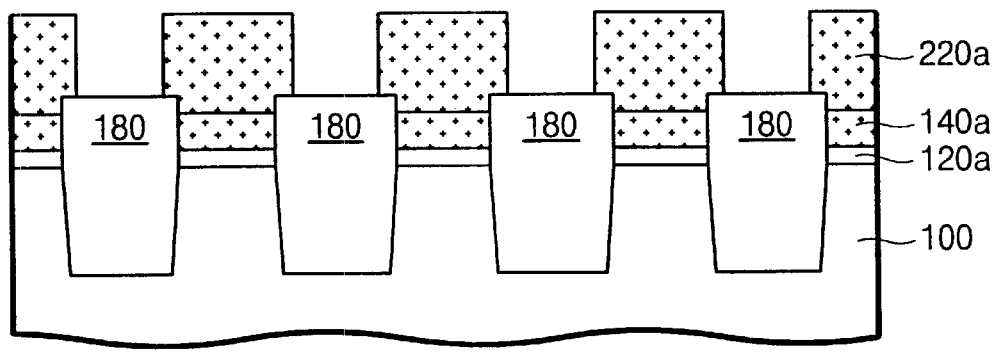
Figure 5C:
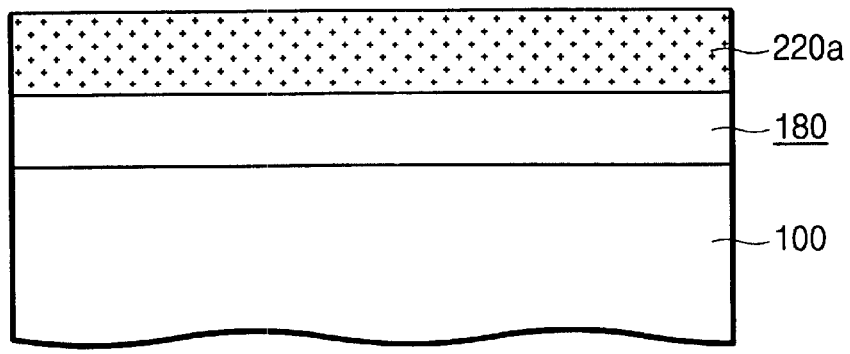

Referring now to FIGS. 5A to 5C, a second floating gate conductive layer is formed on the entire surface of the semiconductor substrate 100 having the STI regions 180 and the common source line regions 200. Then the second floating gate conductive layer is patterned. Specifically, using an etching mask (not shown), a predetermined portion of the second floating gate conductive layer on the STI regions is etched to form a second floating gate pattern 220a that covers the first floating gate pattern 140a and the common source line regions 200. In one embodiment, the first and second floating gate patterns 140a and 220a are made of a polysilicon respectively.

Figure 6A:
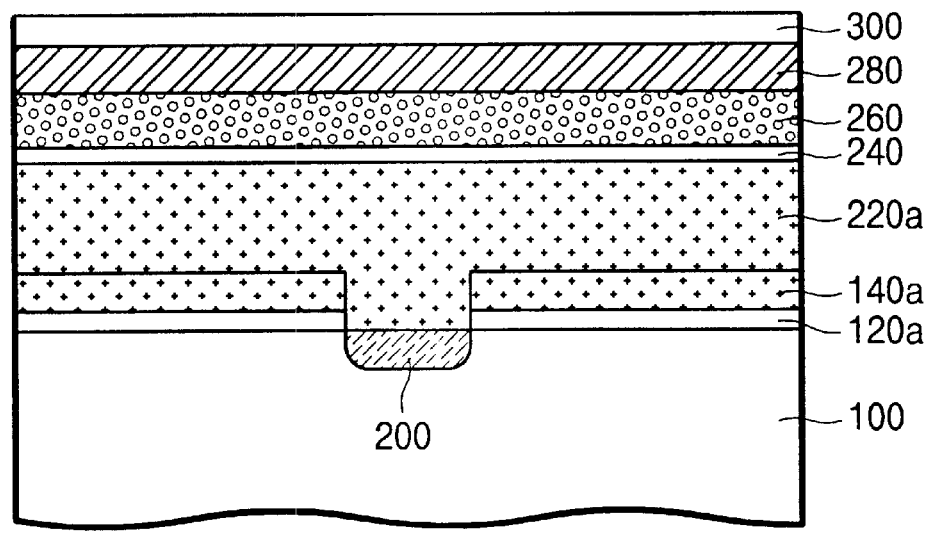
Figure 6B:
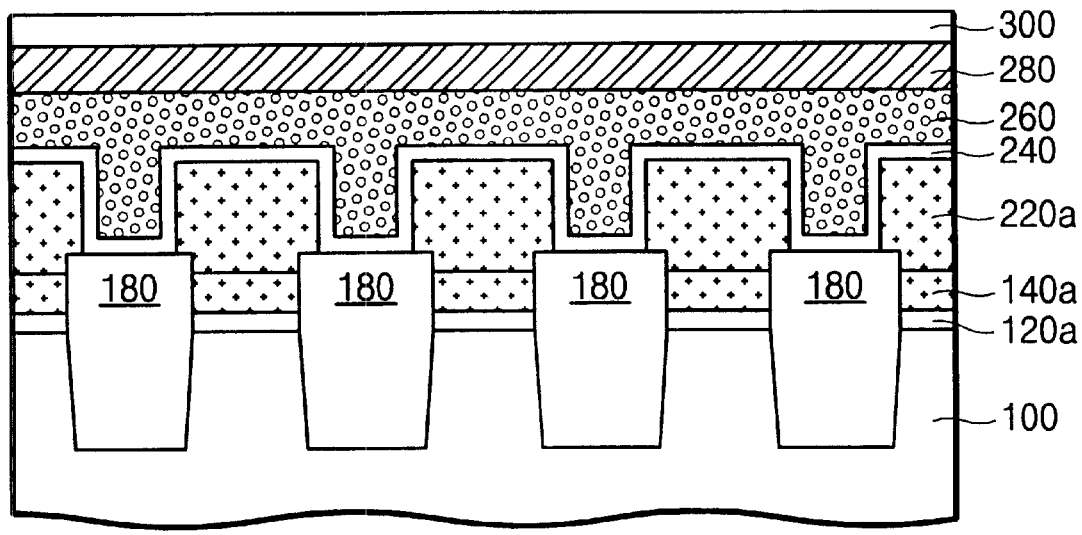
Figure 6C:
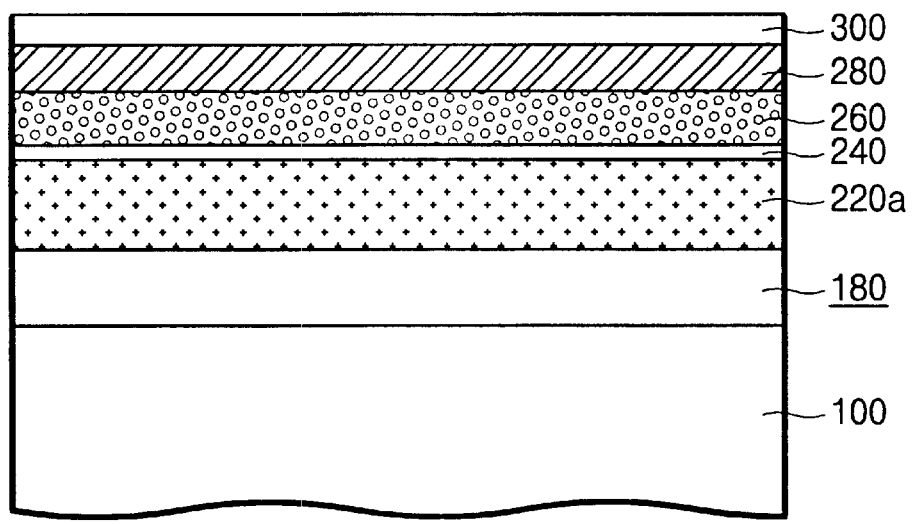

Referring to FIGS. 6A to 6C, an inter-gate insulating layer 240, a control gate conductive layers 260 and 280 and a mask layer 300 are sequentially formed on the second floating gate pattern 220a and on the STI regions 180. Specifically, the inter-gate insulating layer 240 can be made of an ONO (oxide-nitride-oxide) layer, the control gate conductive layer can be made of a polysilicon layer 260 and a tungsten silicide 280. The mask layer 300 can be made of an insulator that has an etching selectivity with respect to the inter-gate insulating layer 240. In one embodiment, the mask layer 300 is made of an oxide by plasma enhanced chemical vapor deposition.

Figure 7A:
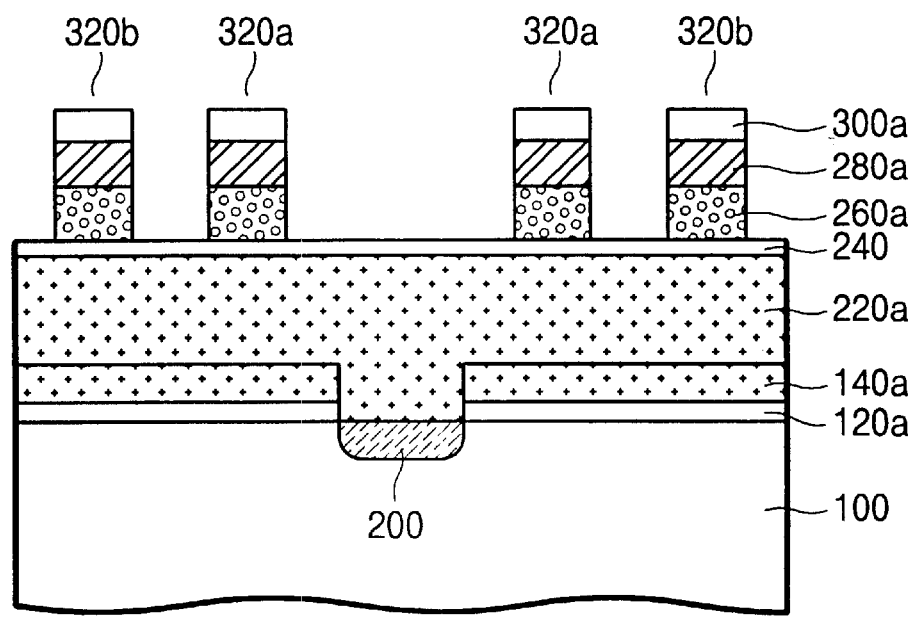
Figure 7B:
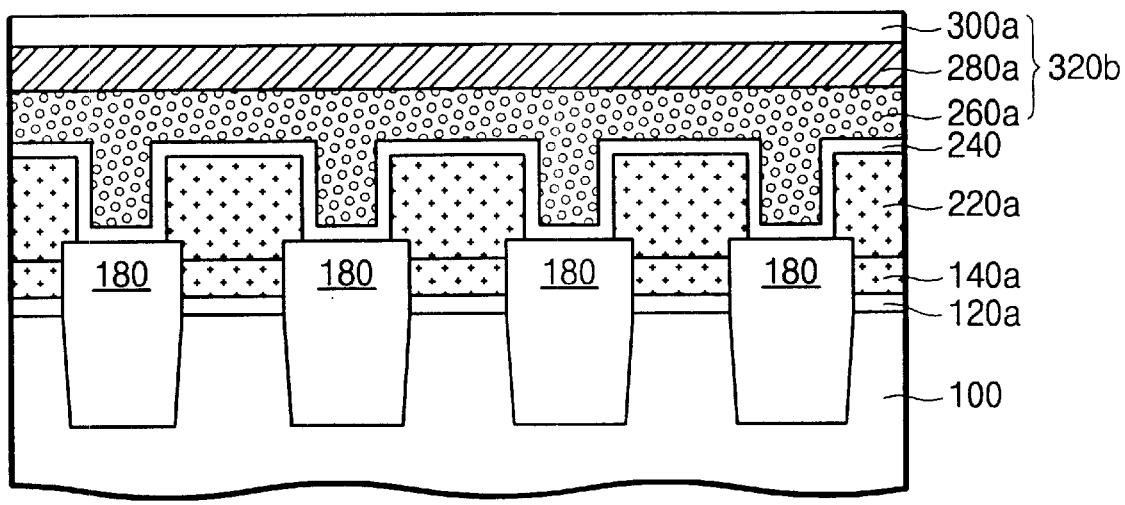
Figure 7C:
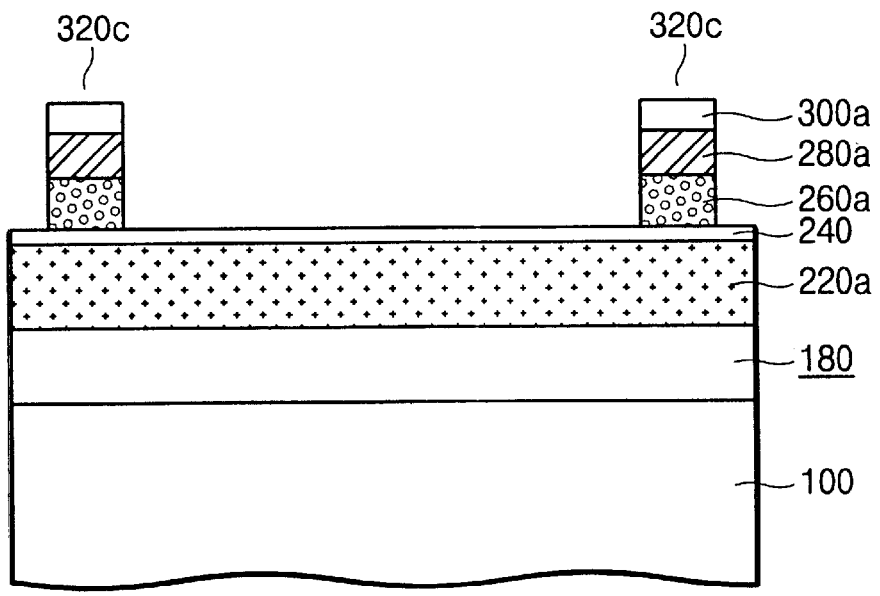

The next process sequence includes the formation of a stacked gate pattern and common source line schematically shown in FIGS. 7 to 9. First, referring to FIGS. 7A to 7C, the mask layer 300 and the control gate conductive layer 280 and 260 ate patterned until a top surface of the inter-gate insulating 240 is exposed, to form a plurality of control gate patterns 320a, 320b, 320c.

Figure 8A:
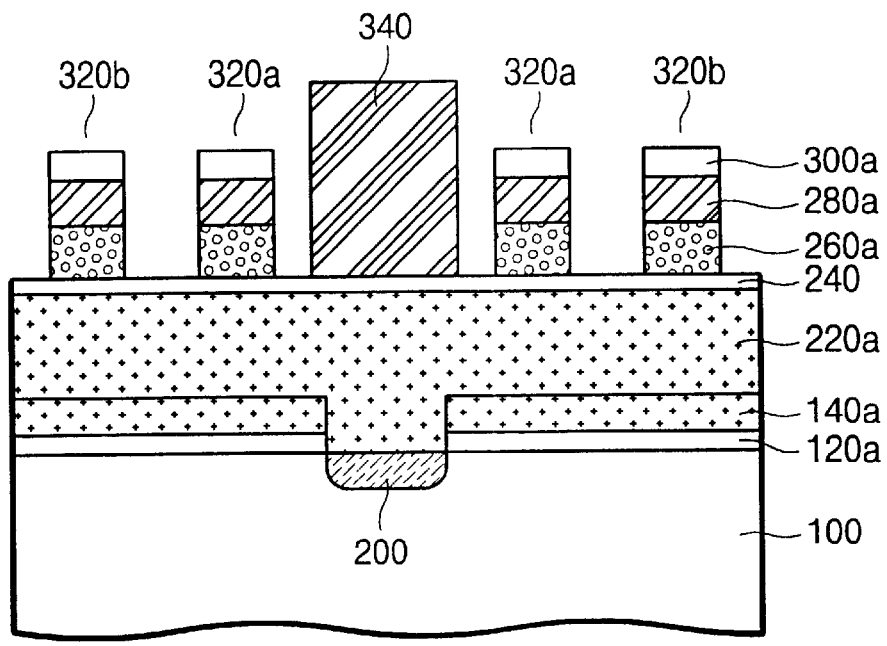
Figure 8B:
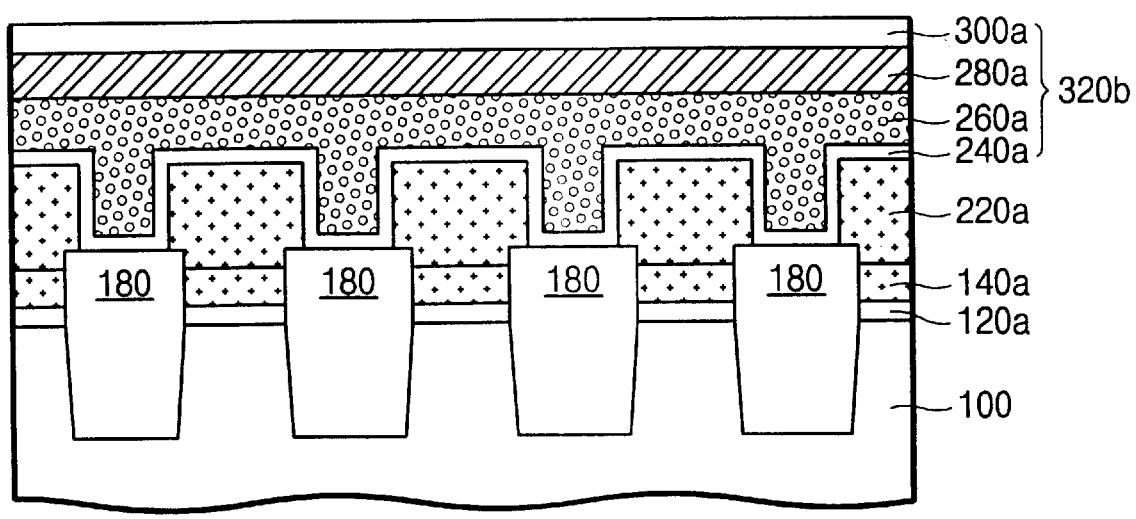
Figure 8C:
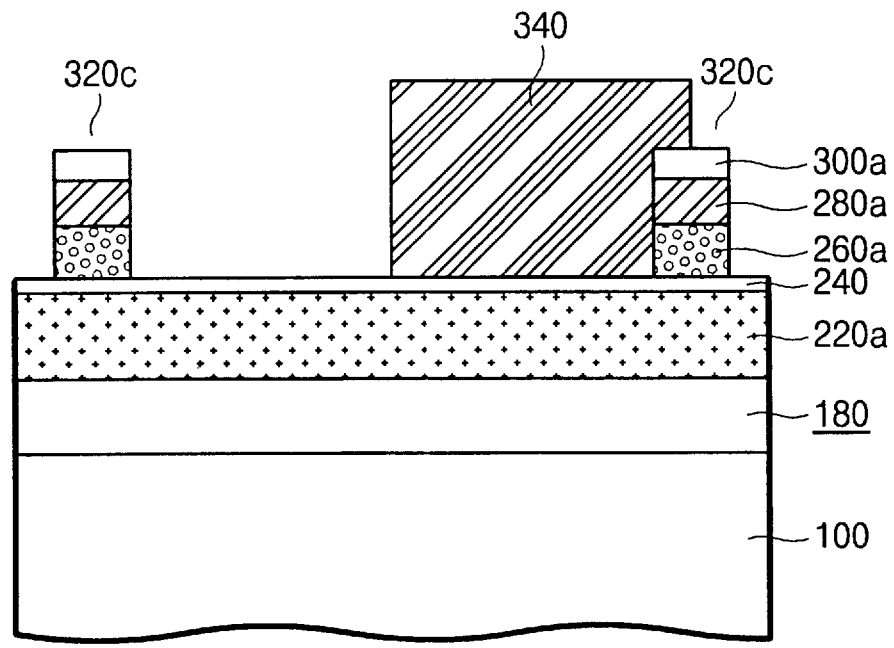
Figure 9A:
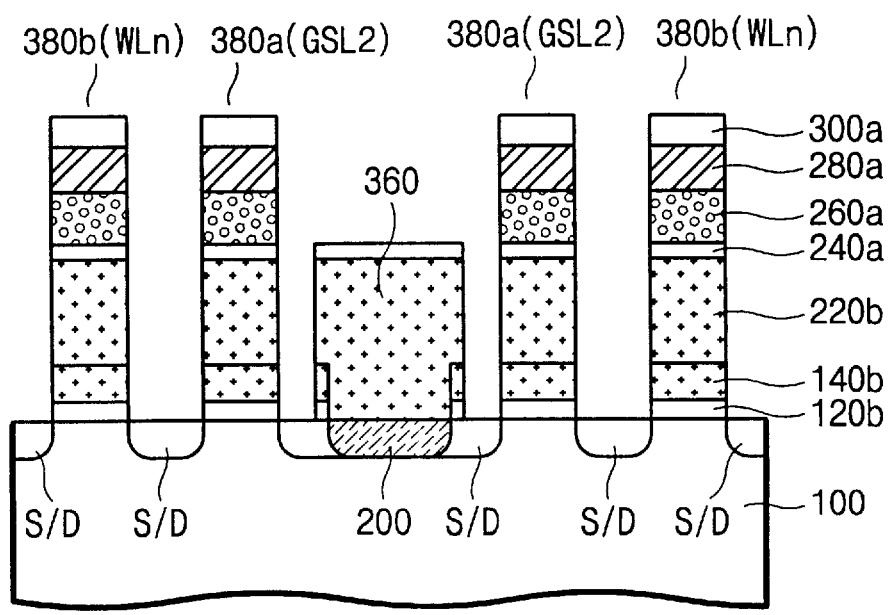
Figure 9B:
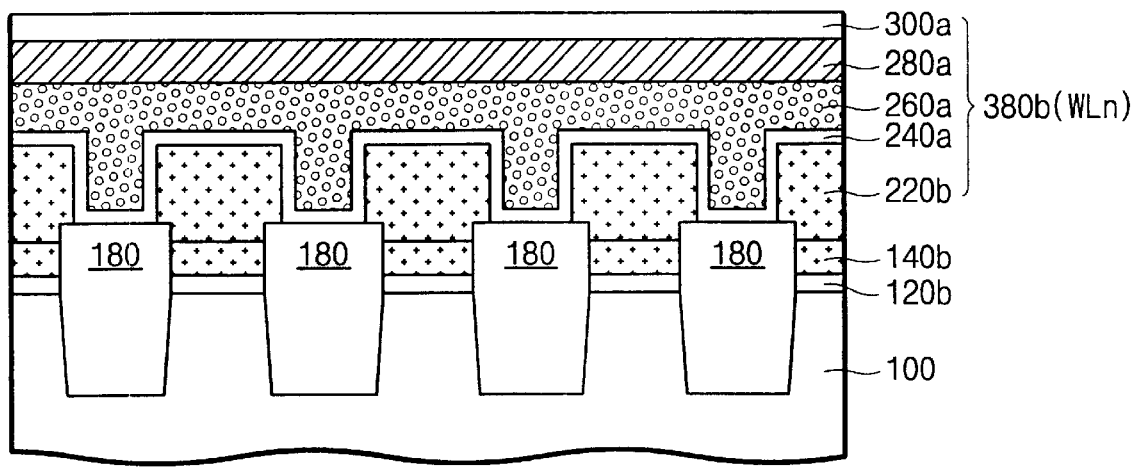
Figure 9C:
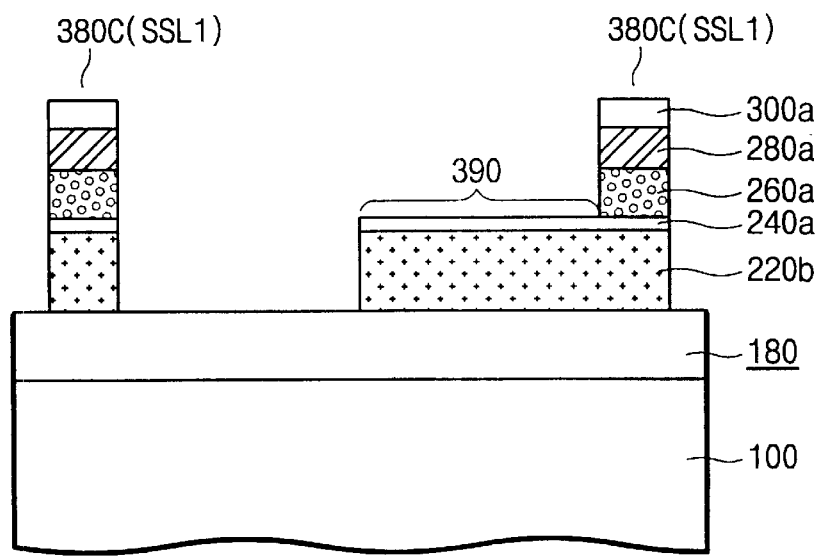

Referring to FIGS. 8A to 8C, a photoresist pattern 340 is formed on the resulting structure having the control gate patterns 320a, 320b, 320c. The photoresist pattern 340 is formed to cover the common source line regions 200 between the control gate patterns 320a. The photoresist pattern 340 is in parallel with the control gate patterns 320a, 320b, 320c and runs across the active regions and the STI regions 180. In one embodiment, the photoresist pattern 340 also covers a butted contact region. Using the photoresist pattern 340 and the mask layer 300a of the control gate patterns 320a, 320b, 320c, underlying the inter-gate insulating layer 240, the second floating gate pattern 220a, the first floating gate pattern 140a and the gate oxide pattern 120a are sequentially etched to form a plurality of a stacked gate patterns 380a, 380b, 380c and a common source line 360 in contact with the common source line regions 200, as shown in FIGS. 9A to 9C. Also, a butted contact region 390 is formed. Since the common source line 360 and the butted contact region 390 are simultaneously formed, the overall manufacturing process can be simplified. The resulting common source line 360 is made of the same layer as the second floating gate pattern 220a and is lower in level than the stacked gate pattern.

The stacked gate patterns 380a outsides of the common source line 360 are ground select line (GSL2). The stacked gate patterns 380b neighbouring the ground select line (GSL2) are word line n(WLn). The stacked gate patterns 380c of FIG. 9C are string select line (SSL1) and a portion of the second floating gate pattern 220b is exposed by the butted contact region 390. A metal contact is to be made to the exposed second floating gate pattern 220b.

Next, using the stacked gate patterns 380a, 380b, 380c and the common source line 340 as an implanting mask, impurities of opposite conductivity type to the active regions of the semiconductor substrate are implanted, to form source/drain regions (S/D). Herein, the second and first floating gate patterns of the ground select line (SGL2) constitute a select transistor (ST2) together with the gate oxide pattern therebelow and impurity diffusion region (S/D) outsides thereof. Likewise, the second and first floating gate patterns of the string select line (SGL2) constitute another select transistor (ST1) together with the gate oxide pattern and impurity diffusion region (S/D). Also, the second and first floating gate patterns of the word line n(WLn) constitute a memory transistor (MTn) together with the gate oxide pattern therebelow and impurity diffusion region (S/D) outside thereof.

Figure 10A:
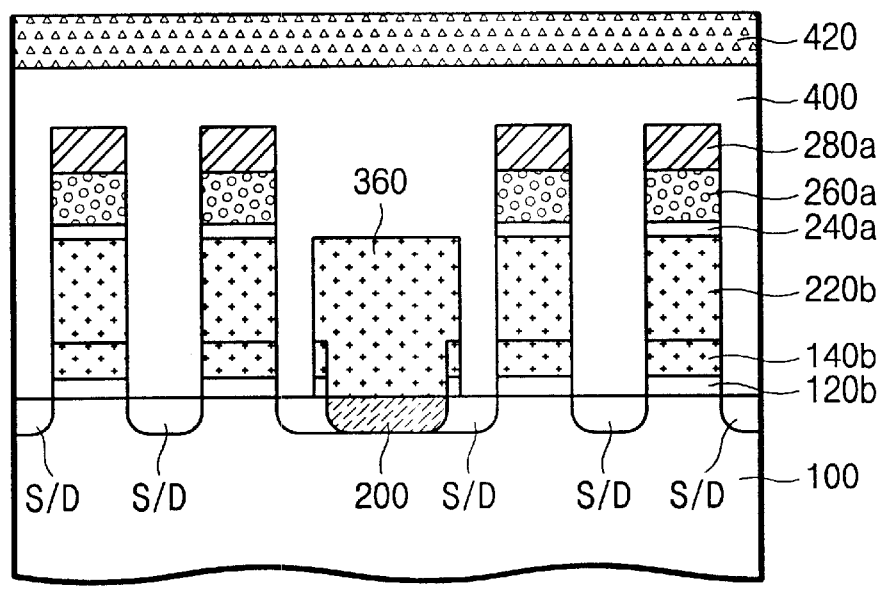
Figure 10B:
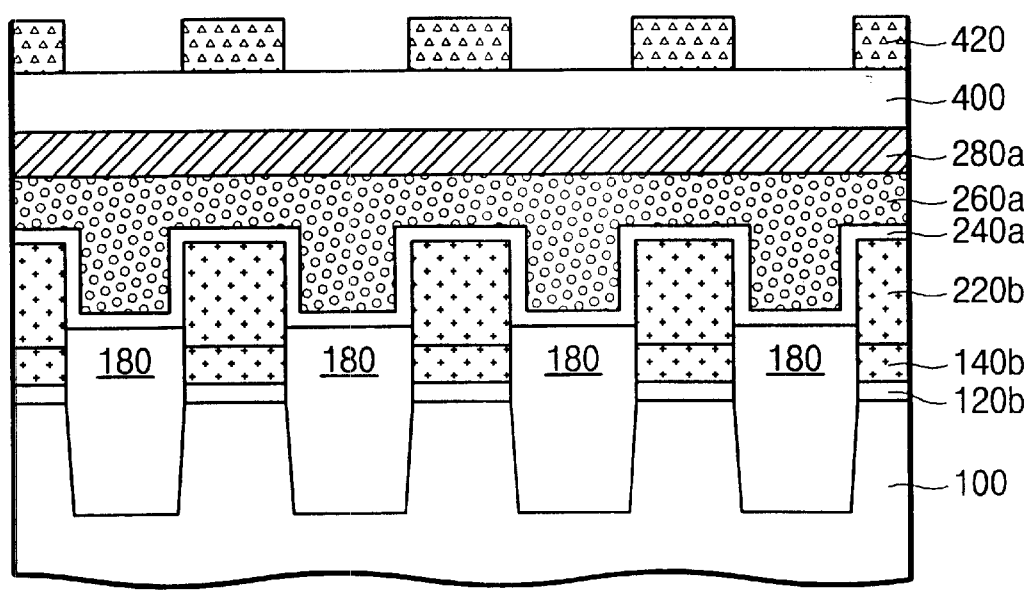
Figure 10C:
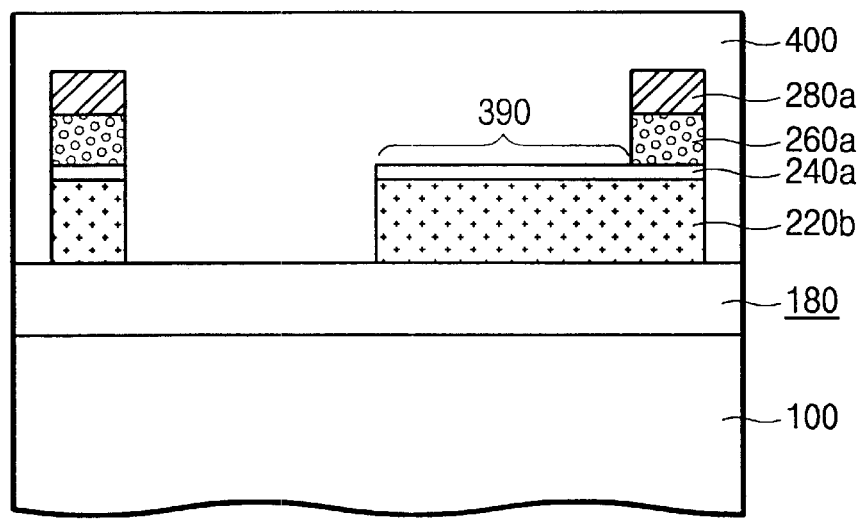

Next, a bit line 420 is formed to be electrically connected to the drain region of the select transistor (ST1) as shown in FIGS. 10A to 10C. More particularly, over the resulting structure having the ground select line (SGL2), string select line (SSL1) and common source line (CSL) is formed an interlayer insulating layer 400. Bit line contact (BC) is formed by patterning the interlayer insulating layer 400 to expose the drain region of the select transistor (ST1). A conductive layer is formed in the bit line contact and on the interlayer insulating layer 400 and patterned to form the bit line 420. Subsequently, a metal interconnection process is carried out conventionally.

According to above-mentioned method, the common source line is made of the same layer as the floating gate. Accordingly, there is no need of the conventional step for forming a common source line, such as forming an insulator over a stacked gate pattern, forming a contact opening by etching the insulator, depositing a conductive material in the contact opening and patterning the conductive material. Also, the common source line is lower in level than the stacked gate pattern. Accordingly, the interlayer insulating layer to be etched for bit line contact formation can be reduced, and incomplete opening of the bit line contact hole can be avoided.

Figure 11:
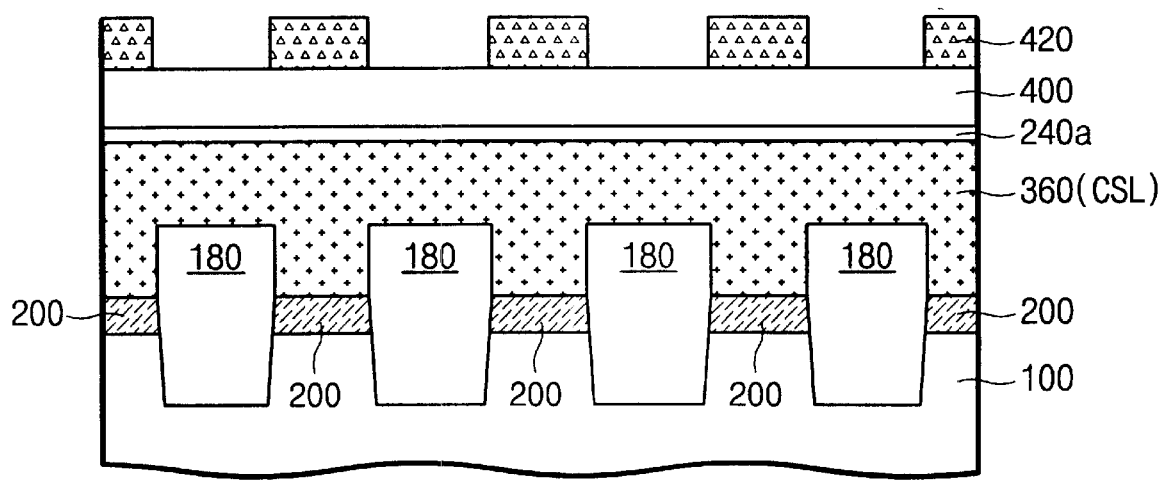
FIG. 11 is a schematic cross-sectional view taken along line IV—IV of FIG. 1A, showing a common source line, in accordance with the present invention.
Figure 12:
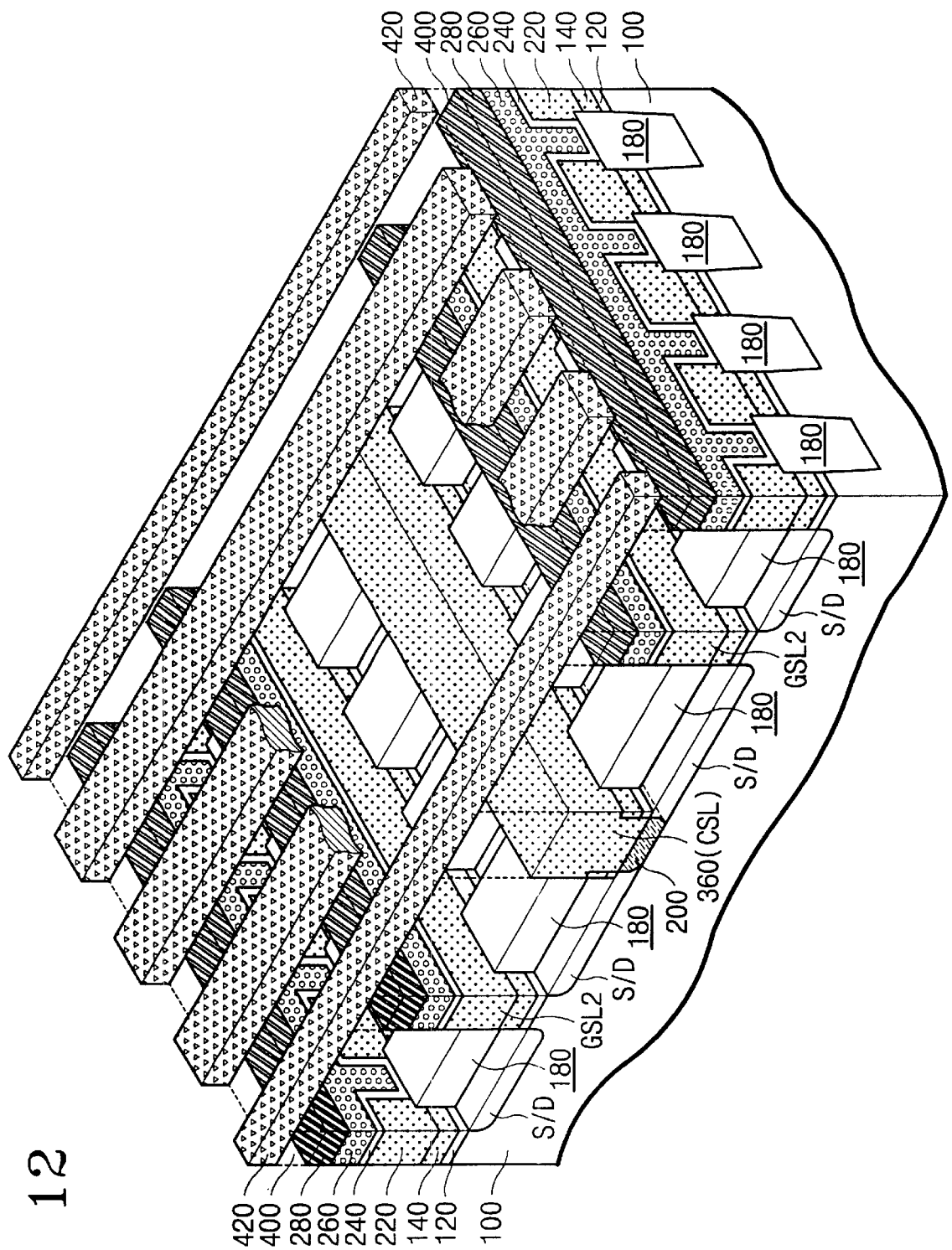
FIG. 12 is a schematic perspective view showing the common source line in accordance with the present invention.

FIG. 11 is a cross-sectional view taken along line IV—IV of FIG. 1A, schematically showing a common source line; and FIG. 12 is a perspective view showing the common source line in accordance with the present invention corresponding to line I—I of FIG. 1A. As shown in FIGS. 11 and 12, the common source line (CSL) 360 is disposed between the ground selected lines (GSL2) and is in contact with the common source line regions 200 and in contact with the STT regions 180. The common source line 360 is made of the same layer as the floating gate pattern 140, 220 of the stacked gate patterns. The stacked gate patterns run in parallel with the common source line 360. Bit lines 420 are disposed over the stacked gate patterns and the common source line 360 with disposing an interlayer insulating layer 400 therebetween, and intersecting the stacked gate patterns and the common source line 360.

While this invention has been particularly shown and described with references to preferred embodiments thereof, it will be understood by those skilled in the art that various changes in form and details may be made therein without departing from the spirit and scope of the invention as defined by the following claims.

For example, after forming the inter-gate insulating layer, the control gate conductive layer and the mask layer as shown in FIGS. 6A to 6C, a photoresist layer pattern defining the common source line and the stacked gate patterns can be formed on the mask layer. In this case, the formation of the mask layer can be skipped. Using the photoresist layer pattern as a mask, the mask layer, the control gate conductive layer, the inter-gate insulating layer, the second floating gate pattern and first floating gate pattern can be sequentially patterned to form a plurality of stacked gate patterns. Through a photo-etching process for butted contact formation, the butted contact region is defined. During this photo-etching process for butted contact formation, the mask layer and the control gate pattern of the stacked gate pattern formed over the common source line regions can also be etched to form the common source line in contact with the common source line regions.

Also, the above-mentioned method can be applied to a NOR type flash memory device.

What is claimed is:

1. A flash memory device cell comprising:
    a plurality of stacked gate patterns formed on a semiconductor substrate, each stacked gate pattern including a gate insulator pattern, a floating gate pattern over the gate insulator pattern, an inter-gate insulator pattern over the floating gate pattern and a control gate pattern over the inter-gate insulator pattern, the floating gate pattern being formed as part of a floating gate layer; and
    a common source line, the common source line also being formed as part of the floating gate layer and having the same level in height as the floating gate pattern.

2. The flash memory device cell according to claim 1, wherein the floating gate pattern is made of a first floating gate and a second floating gate, and the common source line is made of the second floating gate.

3. The flash memory device cell according to claim 1, further comprising:
    a plurality of trench isolation regions at predetermined portions of the semiconductor substrate, said trench isolation regions defining a plurality of active regions therebetween; and
    a plurality of common source line regions formed between predetermined stacked gate patterns; wherein
    the plurality of stacked gate patterns intersect the plurality of trench isolation regions and the active regions, and
    the common source line is in contact with the common source line regions and the plurality of trench isolation regions, and is in parallel with the stacked gate patterns.

4. The flash memory device cell according to claim 1, wherein:
    the floating gate pattern is made of polysilicon;
    the control gate pattern is made of a stacked layer of a polysilicon and tungsten; and
    the inter-gate insulator pattern is made of an ONO (oxide-nitride oxide) layer.

5. The flash memory device cell according to claim 1, further comprising:
    an insulating layer covering the plurality of stacked gate patterns and the common source line; and
    a bit line formed on the insulating layer, the bit line intersecting the common source line.

* * * * *